(12) United States Patent
Kanno

(10) Patent No.: US 6,768,388 B2
(45) Date of Patent: Jul. 27, 2004

(54) VOLTAGE-CONTROLLED PIEZOELECTRIC OSCILLATOR

(75) Inventor: Hiroyuki Kanno, Saitama (JP)

(73) Assignee: Nihon Dempakogyo Co., Ltd., Tokyo (JP)

( * ) Notice: Subject to any disclaimer, the term of this patent is extended or adjusted under 35 U.S.C. 154(b) by 21 days.

(21) Appl. No.: 10/306,913

(22) Filed: Nov. 27, 2002

(65) Prior Publication Data

US 2003/0098751 A1 May 29, 2003

(30) Foreign Application Priority Data

Nov. 29, 2001 (JP) ........................................ 2001-364155

(51) Int. Cl.[7] .............................. H03B 5/32; H03B 5/36
(52) U.S. Cl. ............. 331/158; 331/116 R; 331/116 FE; 331/177 V
(58) Field of Search ........................... 331/36 C, 116 R, 331/116 FE, 117 R, 117 FE, 117 D, 158, 177 V

(56) References Cited

U.S. PATENT DOCUMENTS 6,654,470 B1 * 11/2003 Dilger et al. .............. 381/94.1

* cited by examiner

Primary Examiner—David Mis
(74) Attorney, Agent, or Firm—Knobbe Martens Olson & Bear LLP

(57) ABSTRACT

A voltage-controlled piezoelectric oscillator includes: an inverter having an input and output; a feedback resistor of the inverter; a first capacitor inserted between the inverter input and the ground potential; a second capacitor inserted between the inverter output and the ground potential; and a series circuit which is composed of a piezoelectric vibrator, two variable-voltage capacitance elements such as variable capacitance diodes, and a third capacitor. Each of the variable-voltage capacitance elements has a first terminal and a second terminal, the first terminals being connected to each other. The oscillator further includes a control terminal for applying a control voltage by way of a resistor to the common connection point of the first terminals, and return resistors inserted between the second terminals of variable-voltage capacitance elements and the ground potential.

6 Claims, 2 Drawing Sheets

VOLTAGE-CONTROLLED PIEZOELECTRIC OSCILLATOR

BACKGROUND OF THE INVENTION

1. Field of the Invention

The present invention relates to a voltage-controlled piezoelectric oscillator which employs an inverting amplifier (inverter), and more particularly to a piezoelectric oscillator which features improved linearity of frequency change when the applied control voltage is in the low-voltage range.

2. Description of the Related Art

Voltage-controlled piezoelectric oscillators which employ piezoelectric vibrators and to which a control voltage is applied from the outside are widely used in various electronic apparatuses for obtaining a frequency signal which changes according to the control voltage in the vicinity of the resonance frequency of the piezoelectric vibrator. The control voltage is also used to compensate the temperature-frequency characteristic of the piezoelectric vibrator, whereby a fixed frequency signal can be obtained regardless of the ambient temperature. Quartz-crystal units are widely used as the piezoelectric vibrators, but ceramic vibrators may also be used in addition to crystal units.

FIG. 1 shows the construction of a voltage-controlled crystal oscillator which employs a crystal unit as the piezoelectric vibrator. In this oscillator, inverter 1 composed of, for example, a CMOS (complementary metal-oxide-semiconductor) circuit is used to amplify the resonance frequency component in the oscillation closed loop. Capacitors 2 and 3 are inserted between the input of inverter 1 and ground potential and between the output of inverter 1 and the ground potential, respectively. In addition, feedback resistor 4 is connected between the input and output of inverter 1. A series circuit composed of crystal unit 5, variable-capacitance diode 6, and capacitor 7 is further connected in parallel with feedback resistor 4. Return resistor 9 is provided between the ground potential and the connection point of the anode of variable-capacitance diode 6 and capacitor 7. Control voltage $V_c$ for varying the oscillation frequency is applied by way of resistor a to the cathode of variable-capacitance diode 6. In this oscillator, oscillation output F is obtained from the output terminal of inverter 1.

In this oscillator, feedback resistor 4 is connected between the input and output of inverter 1 and a high level of gain is obtained by inverter 1, and the oscillation output therefore has a large amplitude which nearly rivals the power supply voltage which is supplied to inverter 1.

Regarding the uses of this oscillator, a number of applications exist in which an oscillation output of such great amplitude is preferable, but when constituted as a voltage-controlled oscillator, there is the problem that the high-frequency current which flows to the crystal unit or piezoelectric vibrator becomes excessive. In other words, there are the problems that, when the high-frequency current which flows through a crystal unit or piezoelectric vibrator becomes large, not only does the amount of frequency change become smaller when the capacitance of the variable-capacitance diode is changed, but the change in the oscillator frequency becomes non-linear with respect to change in the control voltage when the control voltage is within the range of a relatively low voltages.

SUMMARY OF THE INVENTION

It is an object of the present invention to provide a voltage-controlled piezoelectric oscillator employing an inverter which can easily obtain a high level of frequency change and excellent frequency linearity even when the control voltage is in a low voltage range.

The object of the present invention is achieved by a voltage-controlled piezoelectric oscillator which includes: an inverter having an input and output; a feedback resistor connected between the input and output; a first capacitor inserted between the input and the ground potential; a second capacitor inserted between the output and the ground potential; a series circuit which is composed of a piezoelectric vibrator, two variable-voltage capacitance elements, and a third capacitor, each variable-voltage capacitance element having a first terminal and a second terminal, the first terminals being connected to each other; a control terminal for applying a control voltage by way of a resistor to the common connection point of the first terminals of the variable-voltage capacitance elements; and return resistors inserted between the ground potential and the second terminals of variable-voltage capacitance elements.

In the present invention, the variable-voltage capacitance elements are components such as variable-capacitance diodes, and the piezoelectric vibrator is a component such as a quartz-crystal unit. When the variable-voltage capacitance elements are variable-capacitance diodes, the first terminals are, for example, the cathodes of the variable-capacitance diodes; and the second terminals are, for example, the anodes of the variable-capacitance diodes.

The present invention can obtain a voltage-controlled piezoelectric oscillator which can broaden the variable range of the oscillation frequency, and moreover, which can of course obtain good linearity in the range of relatively high voltages of the control voltage and that can further obtain good linearity in the range of relatively low voltages in which the maintenance of linearity was difficult in the prior art.

DETAILED DESCRIPTION OF THE INVENTION

Figure 1:
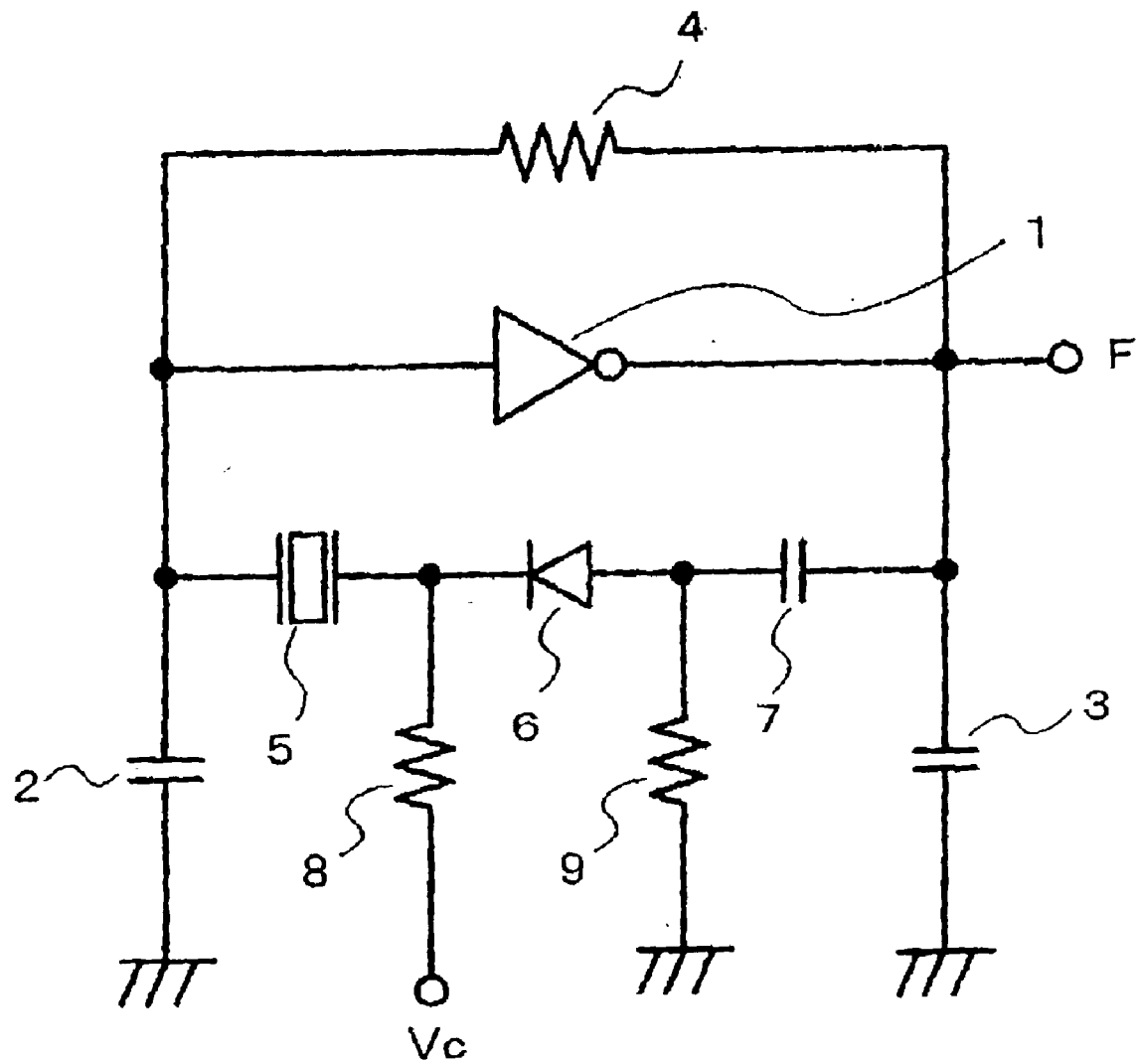
FIG. 1 is a circuit diagram showing an example of the configuration of a conventional voltage-controlled piezoelectric oscillator.
Figure 2:
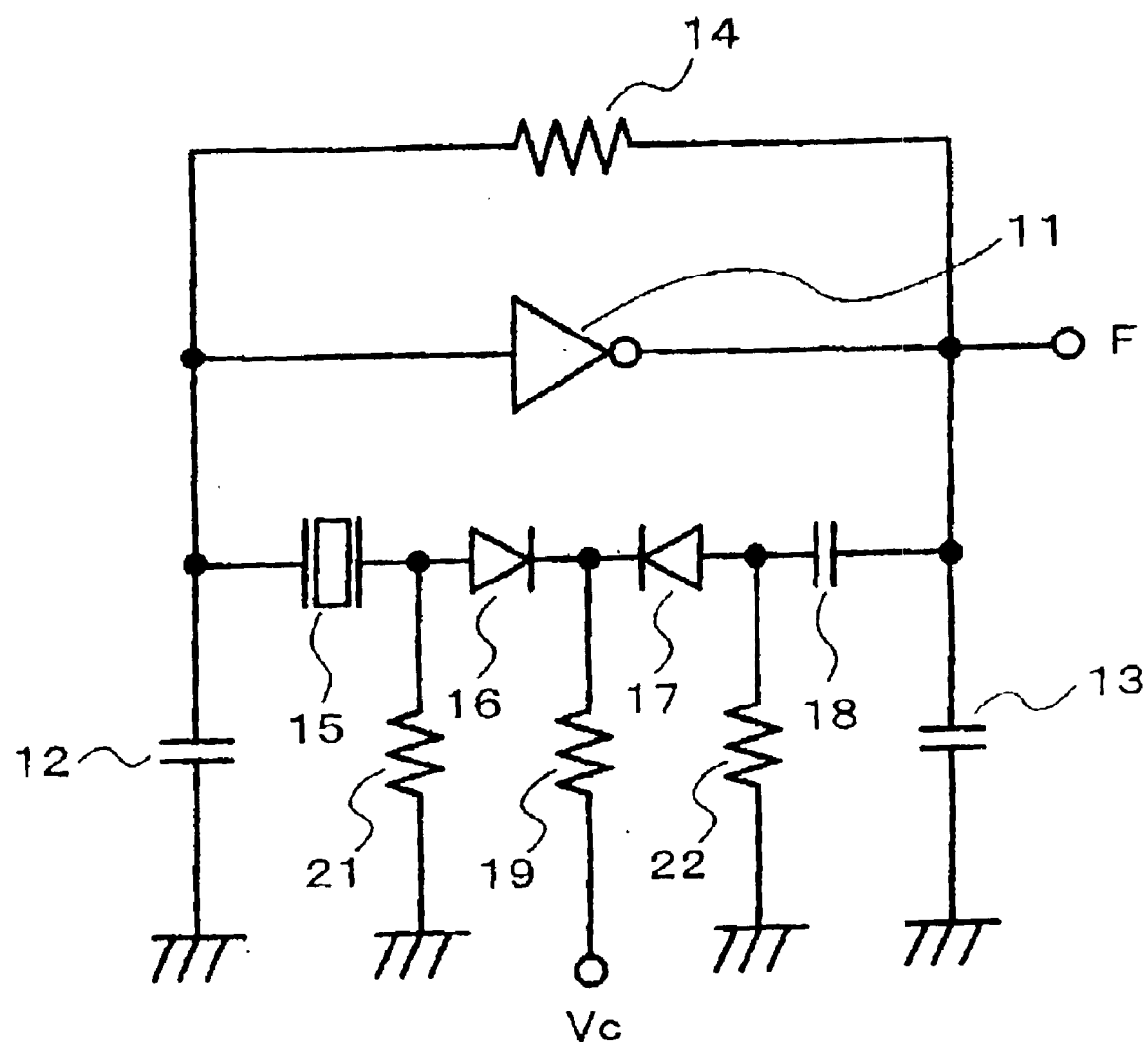
FIG. 2 is a circuit diagram showing the configuration of a voltage-controlled piezoelectric oscillator according to a first embodiment of the present invention.

FIG. 2 shows a voltage-controlled piezoelectric oscillator based on the present invention that employs a quartz-crystal unit as the piezoelectric vibrator.

This oscillator is provided with inverter 11 composed of, for example, a CMOS circuit, for amplifying the resonance frequency component. Capacitor 12 is inserted between the input terminal of inverter 11 and the ground potential, and capacitor 13 is inserted between the output terminal and the ground potential. These capacitors 12 and 13 are for establishing phase conditions which are required for oscillation between the input signal and output signal of inverter 11, which is an inverting amplifier. A power supply voltage from a power supply circuit (not shown in the figure) is supplied to inverter 11.

Feedback resistor 14 is further connected between the input and output of inverter 11 to allow a high level of gain to be obtained in inverter 11. The provision of feedback resistor 14 enables a high level of gain to be obtained, whereby the gain conditions that are necessary for oscillation are satisfied as the entire oscillation loop. A series circuit that is composed of crystal unit 15, two variable-capacitance diodes 16 and 17, and capacitor 18 is connected parallel to feedback resistor 14. The cathodes of variable-capacitance diodes 16 and 17 are connected together, and control voltage $V_c$ for varying the oscillation frequency is applied by way of resistor 19 to the cathodes which are connected in common. The anodes of variable-capacitance diodes 16 and 17 are connected to the ground potential by way of return resistors 21 and 22, respectively. An oscillation closed loop is thus constituted by inverter 11, crystal unit is, variable-capacitance diodes 16 and 17, and capacitor 18.

Oscillation output F is obtained from the output terminal of inverter 11 in this oscillator.

In the oscillator configured according to the foregoing description, a high level of gain can be obtained because feedback resistor 14 is inserted between the input and output of inverter 11, and the oscillator can be caused to oscillate at the resonance frequency of crystal unit 15 that is connected parallel to feedback resistor 14. In addition, the serial connection of two variable-capacitance diodes 16 and 17 to crystal unit 15 allows the load capacitance of crystal unit 15 to be changed by varying control voltage $V_c$ which is applied to variable-capacitance diodes 16 and 17, and therefore allows the oscillation frequency to be varied according to the variation of this load capacitance. Because two variable-capacitance diodes 16 and 17 connected in a series are employed in this case, the serially combined capacitance is one-half the capacitance when using one variable-capacitance diode.

The use of return resistors each having a resistance value in a range of several kilohms to several tens kilohms achieves the functionality of the return resistor that the high-frequency loss is minimized while maintaining the application of the control voltage to the variable-capacitance diode. In addition, adjusting the value of return resistors 21 and 22 enables a reduction of circuit loss when a series circuit which is composed of crystal unit 15, variable-capacitance diodes 16 and 17, and capacitor 18 is operating as a feedback circuit of inverter 11. For example, when the values of return resistors 21 and 22 are set to a low level, the signal which is fed back to the input side from the output of inverter 11 becomes smaller and the high-frequency current which flows through crystal unit 15 also becomes smaller. As a result, the amplitude of oscillation output F also becomes smaller, whereby the amount of change in oscillation frequency can be increased for the same change in load capacitance.

Accordingly, increasing loss in the feedback circuit of inverter 11 to a relatively high level and varying the oscillation frequency within the range of small load capacitance can obtain a relatively great amount of change in the oscillation frequency.

Further, varying the oscillation frequency within this range of low load capacitance allows the oscillation frequency to be changed linearly with respect to change in control voltage $V_c$ and allows excellent linearity to be obtained even when control voltage $V_c$ is within the range of relatively low voltages.

The present invention is not limited to the above-described embodiment and is open to various modifications without departing from the spirit or scope of the appended claims. For example, although explanation was presented regarding a voltage-controlled crystal oscillation circuit that employs a crystal unit as the piezoelectric vibrator in the above-described embodiment, the present invention can also be similarly applied to an oscillation circuit that employs a piezoelectric member such as a ceramic vibrator, and the same effects can be obtained.

What is claimed is:

1. A voltage-controlled piezoelectric oscillator, comprising:

an inverter having an input and output;

a feedback resistor connected between said input and output;

a first capacitor inserted between said input and a ground potential;

a second capacitor inserted between said output and said ground potential;

a series circuit which is composed of a piezoelectric vibrator, two variable-voltage capacitance elements, and a third capacitor, each of said variable-voltage capacitance elements having a first terminal and a second terminal, said first terminals being connected to each other;

a control terminal for applying a control voltage by way of a resistor to a common connection point of said first terminals of said variable-voltage capacitance elements; and a return resistors inserted between said second terminal of each of said variable-voltage capacitance elements and said ground potential.

2. The oscillator according to claim 1, wherein each of said variable-voltage capacitance elements is a variable-capacitance diode.

3. The oscillator according to claim 1, wherein said piezoelectric vibrator is a crystal unit.

4. The oscillator according to claim 2, wherein said first terminal is a cathode of said variable-capacitance diode, and said second terminal is an anode of said variable-capacitance diode.

5. The oscillator according to claim 4, wherein said piezoelectric vibrator is a crystal unit.

6. The oscillator according to claim 1, wherein each of said return resistors has a low resistance value for maintaining linearity of an oscillation frequency in a range of low voltages of said control voltage.

* * * * *